United States Patent
Yang et al.

(10) Patent No.: US 7,266,479 B2
(45) Date of Patent: Sep. 4, 2007

(54) SYSTEM AND METHOD FOR HIGH-ORDER ACCURATE DEVICE MODEL APPROXIMATION

(75) Inventors: Baolin Yang, Fremont, CA (US); Bruce W. McGaughy, Fremont, CA (US)

(73) Assignee: Cadence Designs Systems, Inc., San Jose, CA (US)

( * ) Notice: Subject to any disclaimer, the term of this patent is extended or adjusted under 35 U.S.C. 154(b) by 632 days.

(21) Appl. No.: 10/465,908

(22) Filed: Jun. 18, 2003

(65) Prior Publication Data

US 2004/0260523 A1  Dec. 23, 2004

(51) Int. Cl.
G06F 17/50 (2006.01)
G06T 17/20 (2006.01)
G06F 17/10 (2006.01)

(52) U.S. Cl. .............................. 703/2; 703/13; 702/16; 345/423

(58) Field of Classification Search ................ 703/2, 703/1, 13; 345/418, 420, 423; 702/16; 382/225
See application file for complete search history.

(56) References Cited

U.S. PATENT DOCUMENTS

| | | | | |
|---|---|---|---|---|
| 4,890,242 A | * | 12/1989 | Sinha et al. ................ | 345/419 |
| 5,465,323 A | * | 11/1995 | Mallet ........................ | 345/423 |
| 5,542,030 A | * | 7/1996 | Gutfinger ................... | 345/423 |
| 5,793,371 A | * | 8/1998 | Deering ..................... | 345/418 |
| 5,844,564 A | * | 12/1998 | Bennis et al. .............. | 345/423 |
| 5,923,329 A | * | 7/1999 | Beale ......................... | 345/418 |
| 6,208,939 B1 | * | 3/2001 | Kunii .......................... | 702/5 |
| 6,256,038 B1 | * | 7/2001 | Krishnamurthy ........... | 345/419 |

OTHER PUBLICATIONS

Gordon, W.J. et al. (1973) "Transfinite Element Methods: Blending-Function Interpolation Over Arbitrary Curved Element Domains." *Numerical Mathematics*, 21:109-129.
Harten, A. et al. (1986) "Some Results on Uniformly High-Order Accurate Essentially Nonoscillatory Schemes." *Applied Numerical Mathematics*, 2:347-377.
Harten, A. et al. (1987) "Uniformly High Order Essentially Non-oscillatory Schemes, III." *Journal of Computational Physics*, 71:231-303.
Shu, Chi-Wang. (1990) "Numerical Experiments on the Accuracy of ENO and Modified ENO Schemes." *Journal of Scientific Computing*, 5(2):127-149.
Shu, Chi-Wang. (Nov. 1997) "Essentially Non-Oscillatory and Weighted Essentially Non-Oscillatory Schemes For Hyperbolic Conservation Laws." NASA/CR-97-206253, ICASE Report No. 97-65, Institute for Computer Applications in Science and Engineering, National Aeronautics and Space Administration, Langley Research Center, Hampton, VA, pp. 1-78.
Yang, Baolin. (1998) "Spectral Methods and Absorbing Boundary Conditions for Maxwell's Equations." Ph.D. Dissertation, Division of Applied Mathematics, Brown University, pp. 1-191.

* cited by examiner

*Primary Examiner*—Thai Phan
(74) *Attorney, Agent, or Firm*—Morrison & Foerster LLP

(57) ABSTRACT

An system and method are disclosed for efficiently approximating analytical circuit device models. A preferred embodiment includes a method for obtaining smooth and accurate approximations of analytical device models, comprising the steps of identifying a first set of measurement units; locating two or more sets of units that neighbor one or more of said measurement units; for each set of the two or more sets of neighbor units, obtaining the union of one or more of said sets of neighbor units and the first set of measurement units; calculating the smoothness of the analytical device model within one or more of said unions; and selecting at least one of said unions within which the analytical device model is the smoothest as the new set of measurement units.

27 Claims, 9 Drawing Sheets

SYSTEM AND METHOD FOR HIGH-ORDER ACCURATE DEVICE MODEL APPROXIMATION

FIELD OF THE INVENTION

The present invention relates generally to the field of device model approximation. More particularly, the present invention relates to an efficient system and method for approximating analytical circuit device models.

BACKGROUND OF THE INVENTION

Simulation is an indispensable verification step before committing an integrated circuit to an expensive manufacturing process. An important step in circuit simulation is model evaluation. Modern analytical models such as bsim3 and bsim4 have become more and more complicated and expensive to evaluate in simulation. The percentage of model evaluation time in circuit simulation can be as high as 70–80%. This number can grow to 90% if one includes simulation time spent in using all the individual device evaluations to generate the circuit equations. As a result, model evaluation has become a bottle neck in the improvement of circuit simulation efficiency.

It is becoming more and more difficult to maintain some degree of smoothness in the approximated analytical model due to its complexity. As a result, many resources have been spent in checking the smoothness of device models and the consistency between function values and their derivatives in both the Electronic Design Automation (EDA) and the semi-conductor industries.

A high-order accurate table model is a potential solution to the above problems. Table models provide polynomial approximations of analytical models based on table-grid interpolations of the original current-voltage and charge-voltage (i-v/q-v) curves. Most existing table models use spline interpolation based on a fixed stencil consisting of a fixed group of consecutive interpolation points. Fix stencil interpolations work well if the curve to be approximated is globally smooth. The problem associated with fixed stencil interpolations, however, is that for curves containing a $C^0$ corner point (i.e. curves that are continuous but not differentiable at the corner point), fixed stencil interpolation of second or higher order accuracy will be necessarily oscillatory near the $C^0$ corner point.

The impact of this oscillatory behavior can be illustrated using the example in FIG. 1. Shown in FIG. 1 is the $3^{rd}$-order polynomial approximation with a fixed stencil for the step function. Notice the obvious undershoots near the bottom corner point. Such oscillations are denoted as Gibbs Phenomena in spectral methods. The main characteristics of these oscillations is that they do not decay in magnitude when the mesh or table grid is refined. In other words, no matter how big the table size is (or how large the number of interpolations is), the oscillations still remain at the same magnitude. Besides causing inaccuracy, the non-diminishing oscillations may cause the Newton iteration method to fail in solving nonlinear circuit equations.

Besides causing non-diminishing oscillations, existing table model-based simulation methods also lead to unnecessary memory usage and inefficient memory access. This is because these methods construct and store all the measurement data entries (i. e. table entries) at the beginning of simulation. Storing all the data entries is not necessary since simulations usually only concentrates on "local" data entries surrounding one or more operating points. Moreover, these data entries may contain redundant information since boundaries of these data entries may overlap. Storing these redundant information is certainly unnecessary. Moreover, storing all the table entries at the beginning of simulation makes it impractical to build the table entries adaptively and accurately due to the huge memory consumption.

There is therefore a need to develop a method and system for obtaining smooth, accurate, and computationally efficient approximation of analytical device models.

SUMMARY OF THE INVENTION

The presentation invention includes a method for obtaining smooth and accurate approximations of analytical device models, comprising the steps of identifying a first set of measurement units; locating two or more sets of units that neighbor one or more of said measurement units; for each set of the two or more sets of neighbor units, obtaining the union of one or more of said sets of neighbor units and the first set of measurement units; calculating the smoothness of the analytical device model within one or more of said unions; and selecting at least one of said unions within which the analytical device model is the smoothest as the new set of measurement units.

The present invention also includes a method for obtaining smooth and accurate approximations of analytical device models in a (m+1)-dimensional manifold where m is an integer, comprising the steps of identifying a first set of measurement units in the (m+1)-dimensional manifold; locating two or more sets of units that neighbor one or more of said measurement units; obtaining, for each m-dimensional boundary of the (m+1)-dimensional manifold, an approximation of the analytical device model based on the two or more sets of neighboring points and the first set of measurement units; and blending the approximations obtained for each m-dimensional boundary of the (m+1)-dimensional manifold to produce an approximation of the analytical device model.

The present invention further includes a method for reducing memory usage during circuit simulations, comprising the steps of identifying one or more operating points; obtaining, for each of the one or more operating points, a set of measurement points surrounding said operating point; eliminating overlapping boundaries among each set of measurement points; and constructing a hash table for storing each set of measurement points.

DESCRIPTION OF THE PREFERRED EMBODIMENTS

Figure 1:
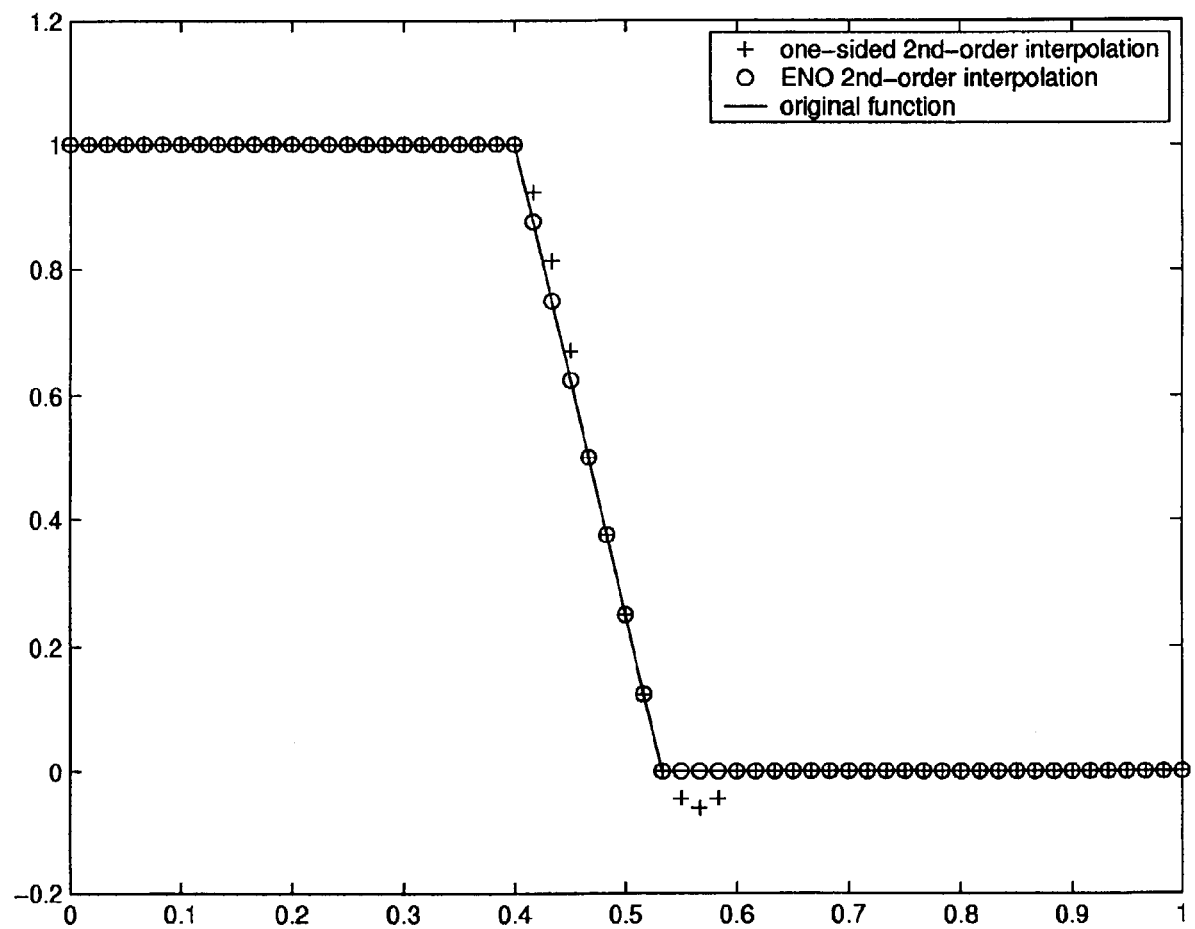
FIG. 1 compares the approximations of a step function obtained using the essentially non-oscillatory (ENO) approximation method and a prior art approximation method.
Figure 2:
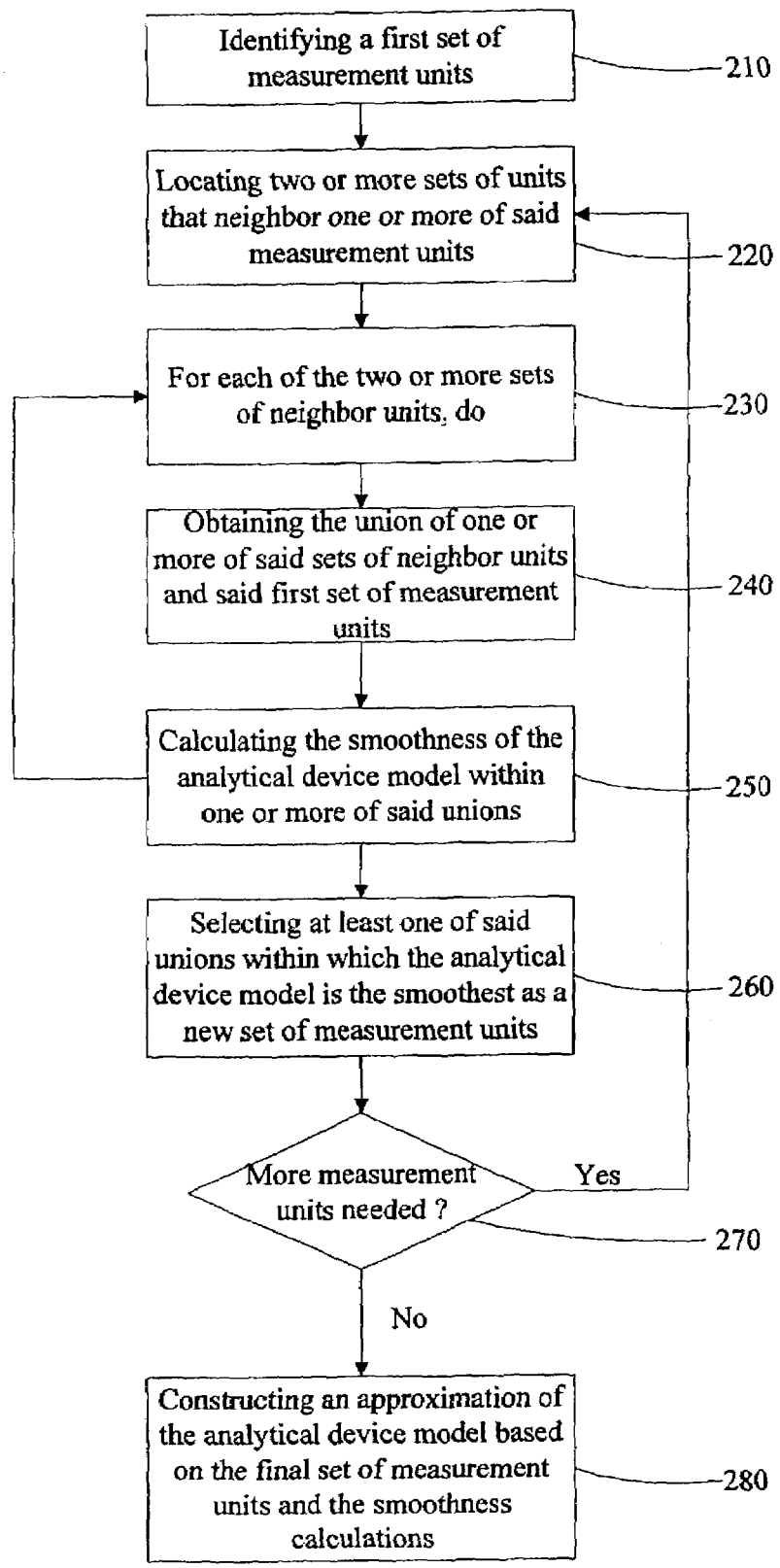
FIG. 2 schematically depicts a flow chart of the ENO-based approximation method.

One preferred embodiment of the present invention uses dynamic stencils to obtain smooth and accurate approximations of analytical device models. A flow chart of this embodiment is depicted in FIG. 2. At step 210, a first set of measurement units is identified. Step 220 locates two or more sets of neighboring units that neighbor one or more of said measurement units. At steps 230–250, for each set of the two or more sets of neighboring units, the dynamic stencil scheme obtains the union of said each set and said first set of measurement units and calculates the smoothness of the analytical device model within the union. At step 260, the dynamic stencil scheme selects at least one of said unions within which the analytical device model is the smoothest as a new set of measurement units. Steps 220–260 are repeatedly iterated until the new set of units achieves the desired accuracy of the analytical device model. The approximated analytical device model is obtained at step 280 based on the final set of measurement units and the smoothness calculations.

The above approximation process can be performed in any subspace of the measurement space and the corresponding measurement units in the subspace can be of any shape. In one embodiment, the approximation process further comprises, before step 210, the steps of providing a partition of the measurement space, and for each partition, executing steps 210–260. The approximated analytical device model is obtained at step 280 based on the final set of measurement units for each partition.

Examples of the dynamic stencil scheme include the Essentially Non-Oscillatory (ENO) schemes, which are described by Harten et al. in [1], the contents of which is hereby incorporated in its entirety by reference. In one embodiment, the original charge (q) curve describing the analytical device model is described by the mapping q: $V \rightarrow R$, where V is a m-dimensional manifold representing the measurement index and R is the set of real numbers representing the measurement value of the original curve. Measurement units and neighboring units are identified based on a measurement index contained in manifold V. The measurement index can be of any shape. In one embodiment, this index is a grid consisting of cells of equal or variable size. Measurement units and neighboring units thus obtain their value from selected grid-points on the grid.

The dynamic stencil grows based on the smoothness calculation of the original curve within sets of stencil points. In one embodiment, the smoothness of the original curve may be obtained by calculating the Newton divided difference of the original curve within the sets of stencil point. Specifically, when the index grid is one-dimensional, the measurement units become the "stencil points". The smoothness calculation and the selection of stencil points can be described as follows:

Given a grid $$a = v_{\frac{1}{2}} < v_{\frac{3}{2}} < \ldots v_{N-\frac{1}{2}} < v_{N+\frac{1}{2}},$$

define cells, cell centers, and cell sizes by $$I_i \equiv \left[v_{i-\frac{1}{2}}, v_{i+\frac{1}{2}}\right], \ v_i \equiv \frac{1}{2}\left(v_{i-\frac{1}{2}} + v_{i+\frac{1}{2}}\right),$$

$$\Delta v_i \equiv v_{i+\frac{1}{2}} - v_{i-\frac{1}{2}}, \ i = 1, 2, \ldots, N.$$

Denote $\Delta v$ as the maximum cell size and represented it by $\Delta v \equiv \max_{I \leq i \leq N} \Delta v$. The approximation problem can be defined as:

Given the cell average of the original curve q(v):

$$\bar{q}_i \equiv \frac{1}{\Delta v_i} \int_{v_{i-\frac{1}{2}}}^{v_{i+\frac{1}{2}}} q(\xi) d\xi, \ i = 1, 2, \cdots, N,$$

find a polynomial $p_i(v)$, of degree at most k–1, for each cell $I_i$, such that it is a k-th order accurate approximation to the function q(v) inside $I_i$, i.e.

$$p_i(v) = q(v) + O(\Delta v^k), v \in I_i, i = 1, \ldots, N. \qquad (1)$$

This gives approximations to the function at cell boundaries which are also -th order accurate, i.e.

$$p_i\left(v_{i+\frac{1}{2}}\right) = q\left(v_{i+\frac{1}{2}}\right) + O(\Delta v^k), \qquad (2)$$

$$p_i\left(v_{i-\frac{1}{2}}\right) = q\left(v_{i-\frac{1}{2}}\right) + O(\Delta v^k), v \in I_i, i = 1, \cdots, N.$$

Function $p_i(v)$ can be replaced by other simple functions, such as exponential functions [2]. For large-scale circuit simulation, polynomial may be the most efficient to evaluate.

The 0-th degree Newton divided differences of function are defined by $$Q\left[v_{i-\frac{1}{2}}\right] \equiv q\left(v_{i-\frac{1}{2}}\right), i = 1, 2, \cdots N.$$

In general, the j-th degree Newton divided differences for $j \geq 1$, are defined inductively by $$Q\left[v_{i-\frac{1}{2}}, \cdots, v_{i+j-\frac{1}{2}}\right] \equiv \frac{Q\left[v_{i+\frac{1}{2}}, \cdots, v_{i+j-\frac{1}{2}}\right] - Q\left[v_{i-\frac{1}{2}}, \cdots, v_{i+j-\frac{3}{2}}\right]}{v_{i+j-\frac{1}{2}} - v_{i-\frac{1}{2}}}$$

The Newton form of the k-th degree interpolation polynomial P(v), which interpolates q(v) at k+1 points starting from grid point $$v_{i-r-\frac{1}{2}}$$

can be expressed using the divided differences by $$P(v) = \sum_{j=0}^{k} Q\left[v_{i-r-\frac{1}{2}}, \cdots, v_{i-r+j-\frac{1}{2}}\right] \prod_{m=0}^{j-1} \left(v - v_{i-r+m-\frac{1}{2}}\right)$$

We can take the derivative of P(v) to obtain p(v):

$$p(v) = \sum_{j=0}^{k} Q\left[v_{i-r-\frac{1}{2}}, \cdots, v_{i-r+j-\frac{1}{2}}\right] \sum_{m=0, m \neq r}^{j-1} \prod_{m=0}^{j-1} \left(v - v_{i-r+m-\frac{1}{2}}\right)$$

An important property of divided difference is:

$$Q\left[v_{i-\frac{1}{2}}, \cdots, v_{i+j-\frac{1}{2}}\right] = \frac{q^{(j)}(\xi)}{j!}$$

for some $\xi$ inside the stencil $$v_{i-\frac{1}{2}}, < \xi < v_{i+j-\frac{1}{2}},$$

as long as the function q(v) is smooth inside the stencil. Thus the divided difference is a measurement of the smoothness of the curve inside the stencil.

Based on these definitions, the dynamic selection of stencils can be described as follows. Suppose we want to find a stencil of k+1 consecutive points, which must include $$v_{i-\frac{1}{2}} \text{ and } v_{i+\frac{1}{2}},$$

such that q(v) is the "smoothest" in this stencil comparing with other possible stencils. This job may be performed in the preferred embodiment by the following steps. In each step only one point may be added to the stencil. Start with the two point stencil $$\overline{S_2}(i) = v_{i-\frac{1}{2}}, v_{i+\frac{1}{2}}$$

The linear (1-th degree) interpolation on the stencil can be written in the Newton form as $$P^1(v) = Q\left[v_{i-\frac{1}{2}}\right] + Q\left[v_{i-\frac{1}{2}}, v_{i+\frac{1}{2}}\right]\left(v - v_{i-\frac{1}{2}}\right)$$

At the next step, since the grid is one-dimensional, only two choices exist to expand the stencil by adding one point: either adding the left neighbor $$v_{i-\frac{3}{2}},$$

resulting in the following quadratic interpolation $$R(v) = P^1(v) = Q\left[v_{i-\frac{3}{2}}, v_{i-\frac{1}{2}}, v_{i+\frac{1}{2}}\right]\left(v - v_{i-\frac{1}{2}}\right)\left(v - v_{i+\frac{1}{2}}\right)$$

or the right neighbor $$v_{i+\frac{3}{2}},$$

resulting in the following quadratic interpolation $$R(v) = P^1(v) = Q\left[v_{i-\frac{1}{2}}, v_{i+\frac{1}{2}}, v_{i+\frac{3}{2}}\right]\left(v - v_{i-\frac{1}{2}}\right)\left(v - v_{i+\frac{1}{2}}\right)$$

Note that the derivation of the above two interpolations have the same element $$\left(v - v_{i-\frac{1}{2}}\right)\left(v - v_{i+\frac{1}{2}}\right)$$

multiplied by two different constants $$Q\left[v_{i-\frac{3}{2}}, v_{i-\frac{1}{2}}, v_{i+\frac{1}{2}}\right] \text{ and } Q\left[v_{i-\frac{1}{2}}, v_{i+\frac{1}{2}}, v_{i+\frac{3}{2}}\right].$$

These two constants are the two second degree divided differences of q(v) in two different stencils. Note that a smaller divided difference implies the function is "smoother" in that stencil. The selection of stencil can thus be performed by comparing the two relevant divided differences and picking the one with a smaller absolute value. Thus, if $$\left|Q\left[v_{i-\frac{3}{2}}, v_{i-\frac{1}{2}}, v_{i+\frac{1}{2}}\right]\right| < \left|Q\left[v_{i-\frac{1}{2}}, v_{i+\frac{1}{2}}, v_{i+\frac{3}{2}}\right]\right| \quad (3)$$

The 3 point stencil will be selected as $$\overline{S_3}(i) = v_{i-\frac{3}{2}}, v_{i-\frac{1}{2}}, v_{i+\frac{1}{2}}$$

Otherwise, the stencil will be selected as $$\overline{S_3}(i) = v_{i-\frac{1}{2}}, v_{i-\frac{1}{2}}, v_{i+\frac{3}{2}}$$

The step can be continued, with one point added to the stencil at each step, until the desired number of points in the stencil is reached. In general, to obtain a m-th order interpolating polynomial, a stencil with m+1 points is required.

If the index grid is uniform ($\Delta v_i = \Delta v$), undivided differences $$\left(Q\left[v_{i+\frac{1}{2}}, \cdots, v_{i+j-\frac{1}{2}}\right] - Q\left[v_{i-\frac{1}{2}}, \cdots, v_{i+j-\frac{3}{2}}\right]\right)$$

can be used instead. In this case, the Newton formulae (1) and (2) for obtaining interpolating polynomials should also be adjusted accordingly. This saves computation time and reduces round-off errors.

It is shown in [1] that for a piecewise smooth function q(v), ENO-based method starting with a two point stencil has the following properties:

1. The accuracy condition $$p_i(v) = q(v) + O(\Delta v^k), v \in I_i$$

is valid for any cell $I_i$ which does not contain a $C^0$ corner point. This implies that the ENO-based method can recover the full high order accuracy right up to the point.

2. $p_i(v)$ Is monotone in any cell $I_i$ which does contain a "very sharp transition" or discontinuity of q(v).

3. The reconstruction is TVB (total variation bounded). That is, there exists a function z(v), satisfying $$z(v) = q(v) + O(\Delta v^{k-1}), v \in I_i$$

for any cell $I_i$, including those cells which contain transitions, such that $$TV(z) \leq TV(Q)$$

where TV(.) is the total variance function.

In practice, a wrong stencil may be selected due to a round-off error of the divided difference calculation. That is, when both divided differences are near zero, a small change at the round off level would change the direction of the inequality (1) and hence the stencil selection. To remedy this problem, a "biasing" strategy may be introduced to weigh the selection towards a preferred stencil. In one embodiment, the biasing strategy is implemented as follows.

First, identifying a preferred stencil $$\overline{S_{pref}}(i) = v_{i-r-\frac{1}{2}}, \cdots, v_{i-r+k+\frac{1}{2}}$$

Next, replacing (3) by $$\left|Q\left[v_{j-\frac{1}{2}}, \cdots, v_{j+l-\frac{1}{2}}\right]\right| < b\left|Q\left[v_{i+\frac{1}{2}}, \cdots, v_{j+l-\frac{1}{2}}\right]\right|$$

if $$v_{j+\frac{1}{2}} > v_{i-r+\frac{1}{2}}$$

i.e. if the left-most point $v$ $$j + \frac{1}{2}$$

of the current stencil has not reached the left-most point $v$ $$i - r + \frac{1}{2}$$

of the preferred stencil; otherwise if $$v_{j+\frac{i}{2}} \leq _{i-r+\frac{1}{2}}$$

one replace (3) by $$b\left|Q\left[v_{j-\frac{1}{2}}, \cdots, v_{j+l-\frac{1}{2}}\right]\right| < \left|Q\left[v_{i+\frac{1}{2}}, \cdots, v_{j+l+\frac{1}{2}}\right]\right|$$

Where b>1 is the biasing parameter. Analysis in [3] indicates a good choice of the parameter is b=2. The philosophy is to stay as close as possible to the preferred stencil, unless the alternative is a factor b>1 better in smoothness.

Device models are usually described with charge and current functions with three voltages as independent variables. To best reflect the original model, the preferred embodiment uses multidimensional grids to describe the independent variables and uses multidimensional tables to store the grid indices and values of stencil points.

Figure 3:
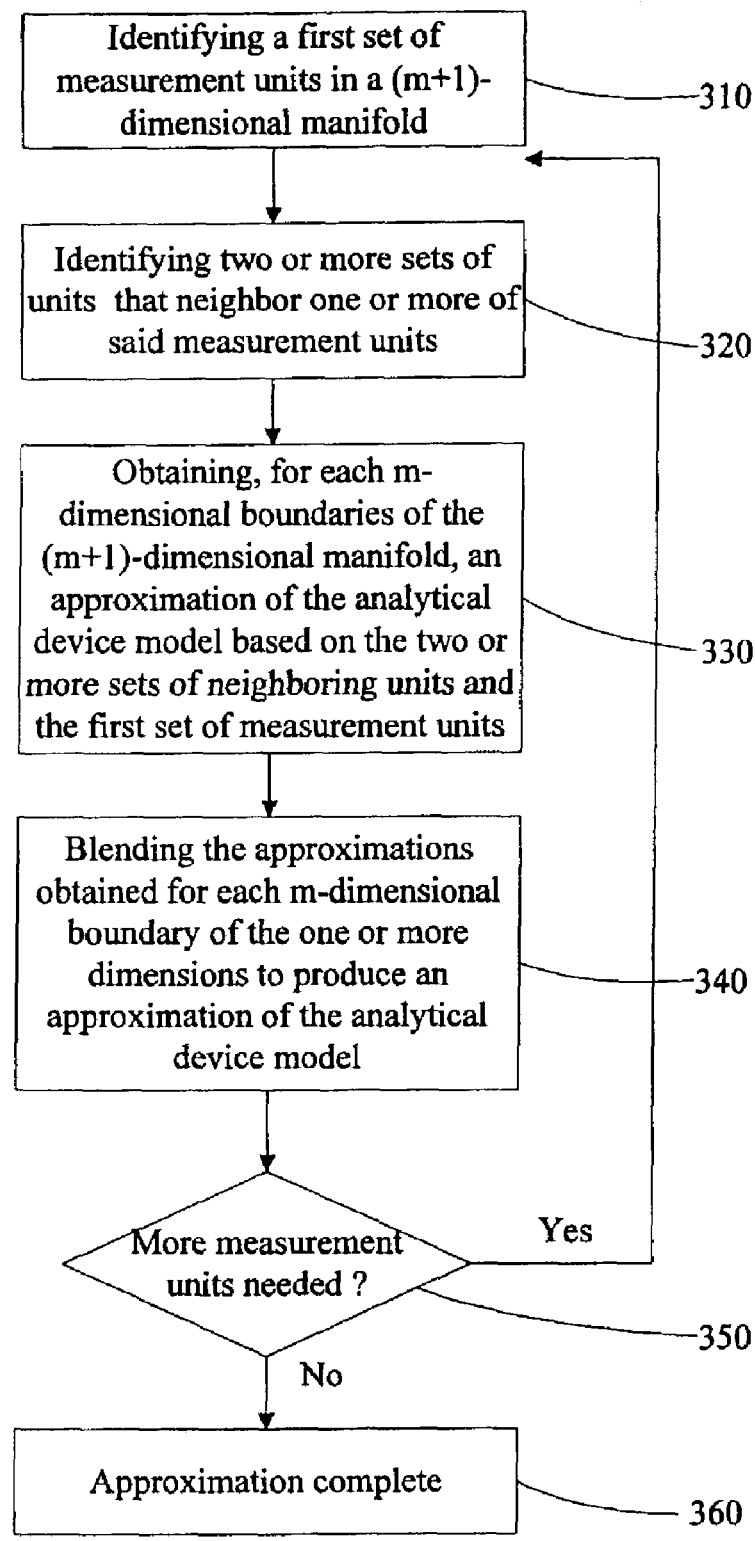
FIG. 3 schematically depicts a flow chart of an embodiment of the ENO-based approximation method in a m-dimensional manifold.

In obtaining approximation of device models in the general m-dimensional space $\Omega \subset V^m$, enclosed by boundary $\delta\Omega$, the most natural and computationally efficient extension of polynomial approximations to multi-dimension appears through the use of tensor products. FIG. 3 illustrates a flow chart of this approximation method. At step 310, a set of measurement units is first identified in a (m+1)-dimensional manifold where m is an integer. Step 320 identifies two or more sets of units that neighbor one or more of said measurement units. For each m-dimensional boundaries of the (m+1)-dimensional manifold, step 330 obtains an approximation of the analytical device model based on the two sets of neighboring units and the first set of measurement units. Step 340 blends the approximations obtained for m-dimensional boundaries of the (m+1)-dimensional manifold to produce an approximation of the analytical device model. Steps 310–340 iterate repeatedly until the set of units achieves the desired accuracy of the analytical device model. In one embodiment, step 340 is implemented as follows.

Let $D^k$, k=1, ..., K be K non-overlapping general hexahedrals such that $$\Omega = \bigcup_{k=1}^{K} D^k, \delta\Omega = \bigcup_{k=1}^{K} \delta D_{kk}, \delta D^k = \bigcup_{k=1}^{K} \delta D_{ki}$$

where $\delta D_{kk} = D^k \cap \delta\Omega$ and $\delta D_{ki} = D^k \cap D^i$ for $i \neq k$, and there exists a diffeomorphism, $\Psi: D^k \rightarrow I$, where $I \subset V^m$ is the unit cube, i.e. $I \in [-1,1]^m$. The introduction of the diffeomorphism ensures that a standard interpolation and blending scheme described in [2] can be applied in the unit cube. The existence of the diffeomorphism is guaranteed since a circuit simulator is always free to decompose the manifold. The non-overlapping $D^k$ is usually rectangular in shape with different size. This is because devices have fine local behavior or sharp transitions such as the sub-threshold behavior of MOSFETS. In order to resolve sharp transitions and keep the table size small, a non-uniform $D^k$ may be used, i.e. smaller sizes are used at sharp transition regions and bigger sizes at smooth regions.

For simplicity, $D^k$ is denoted as D with boundary $\delta D$, referring to any rectangular grid table cell. The coordinates of D will be denoted as $(v_1, v_2, v_2)$ or $(\xi, \eta, \zeta)$, interchangeably. Define $$\Xi_L = \Xi_L^\xi \times \Xi_L^\eta \times \Xi_L^\zeta$$

through the subsets $$\Xi_L^\xi = \{\bar{i}|i \in [0, \ldots, L_\xi]\},$$
$$\Xi_L^\eta = \{\bar{j}|j \in [0, \ldots, L_\eta]\}, \Xi_L^\zeta = \{\bar{k}|k \in [0, \ldots, L_\zeta]\},$$

Associated with these sets are nodal sets $$\Lambda_L^\xi(\Xi_L^\xi) = \{\xi_i\}_{i=0}^{L_\xi}, \Lambda_L^\eta(\Xi_L^\eta) = \{\eta_j\}_{j=0}^{L_\eta}, \Lambda_L^\zeta(\Xi_L^\zeta) = \{\zeta_k\}_{k=0}^{L_\zeta},$$

with the global nodal set, $$\Lambda_L(\Xi_L) = \Lambda_L = \Lambda_L^\xi \times \Lambda_L^\eta \times \Lambda_L^\zeta$$

The nodal sets are assumed to be ordered such that $\xi_0 = \eta_0 = \zeta_0 = -1$, $\xi_{L_\xi} = \eta_{L_\eta} = \zeta_{L_\zeta} = 1$.

Likewise, for the construction of the polynomial approximation inside the domain I, introduce the global set $$\Xi_N = \Xi_N^\xi \times \Xi_N^\eta \times \Xi_N^\zeta$$

where $$\Xi_N^\xi = \{\bar{i}|i \in [0, \cdots, N_\xi]\},$$
$$\Xi_N^\eta = \{\bar{j}|j \in [0, \cdots, N_\eta]\},$$
$$\Xi_N^\zeta = \{\bar{k}|k \in [0, \cdots, N_\zeta]\},$$

with the corresponding nodal sets $$\Lambda_N^\xi(\Xi_N^\xi) = \{\xi_i\}_{i=0}^{N_\xi}, \Lambda_N^\eta(\Xi_N^\eta) = \{\eta_j\}_{j=0}^{N_\eta}, \Lambda_N^\zeta(\Xi_N^\zeta) = \{\zeta_k\}_{k=0}^{N_\zeta},$$

For simplicity, the notation $$\Xi_N^{\xi\eta} = \Xi_N^\xi \times \Xi_N^\eta$$

and likewise were used for various combinations of the sets.

To establish a one to one mapping between the unit cube and the general rectangle-shaped cell, a global map $\Psi:D^k \rightarrow I$, may be constructed in one embodiment using the so-called transfinite blending functions, which are described in [2], the content of which is hereby incorporated in its entirety by reference. The map $x = \Psi^{-1}(\xi)$ in one embodiment may be derived from the Boolean sum $$q = (P_\xi(q) \oplus P_\eta(q) \oplus P_\zeta(q))q(\xi)$$
$$= P_\xi(q) + P_\eta(q) + P_\zeta(q) - P_\zeta P_\eta(q) - P_\xi P_\zeta(q) - P_\eta P_\zeta(q) + P_\xi P_\eta P_\zeta(q)$$

where $$P_\xi(q) = \sum_{\Xi_L^\xi} N_i^\xi(\xi) q(\xi_i, \eta, \zeta)$$

and likewise for $P_\eta(q), P_\zeta(q)$, are denoted as "face projectors". The "shape functions"

$$N_i^\xi, N_j^\eta, N_k^\zeta$$

associated with these face projectors are nothing more than the interpolating ENO polynomials based on nodal sets $$\Lambda_L^\xi, \Lambda_L^\eta, \Lambda_L^\zeta$$

respectively. Using the properties of projectors, the "edge projectors" become $$P_\xi P_\eta(q) = \sum_{\Xi_L^{\xi\eta}} N_i^\xi(\xi) N_j^\eta(\eta) q(\xi_i, \eta_j, \zeta)$$

and likewise for $P_{\eta\zeta}(q), P_{\xi\zeta}(q)$. The "vertex projector" becomes $$P_\xi P_\eta P_\zeta(q) = \sum_{\Xi_L} N_i^\xi(\xi) N_j^\eta(\eta) N_k^\zeta(\zeta) q(\xi_i, \eta_j, \zeta_k)$$

To simplify things further, the following transfinite blending function may also be applied to construct the face projectors.

$$q = (P_\eta(q) \oplus P_\zeta(q)) q(\xi_i, \eta, \zeta)$$
$$= P_\eta(q(\xi_i, \eta, \zeta)) + P_\zeta(q(\xi_i, \eta, \zeta)) - P_\eta P_\zeta(q(\xi_i, \eta, \zeta))$$

and similarly for other face projectors. With the above reconstruction procedure, it is guaranteed that the device model approximations are continuous over all the interfaces between cells. This is because they are constructed uniquely from the node points and some neighboring points on the plane. By using the previously-mentioned biasing scheme in ENO approximation, the derivatives are also continuous in smooth regions where the ENO approximation in each dimension of the gird chooses the points on the same side.

With the above formulations, the inverse of the global map can be constructed in a preferred embodiment as follows. Assuming the shape functions are linear, i.e.

$$L_\xi = L_\eta = L_\zeta = 1,$$

$$\Lambda_L^\xi = \Lambda_L^\eta = \Lambda_L^\zeta = \{-1, 1\}$$

$$N_0^\xi = (1-\xi)/2, N_1^\xi = (1+\xi)/2$$

and similarly for the other shape functions:

$$N_j^\eta, N_k^\zeta$$

Thus, to construct the map a parametric form is established for the edges enclosing D, e.g.

$$q(\xi, -1, -1) = \sum_{\Xi_N^\xi} q(\xi_i, -1, -1) L_i^\alpha(\xi)$$

Where $L_i^\alpha(\xi)$ is the ENO approximating polynomial based on the nodal set $\Lambda_N^\xi$, employed in the unite cube I. For a through discussion of transfinite blending functions and their properties, please refer to [2].

Though computation required in table model evaluation is just a small percentage of analytical device model evaluation, what could cause inefficiency is the time for gathering the multi-dimensional table data. To solve this problem, one embodiment uses a cell-based data storage scheme that achieves efficient table model evaluation.

Figure 4:
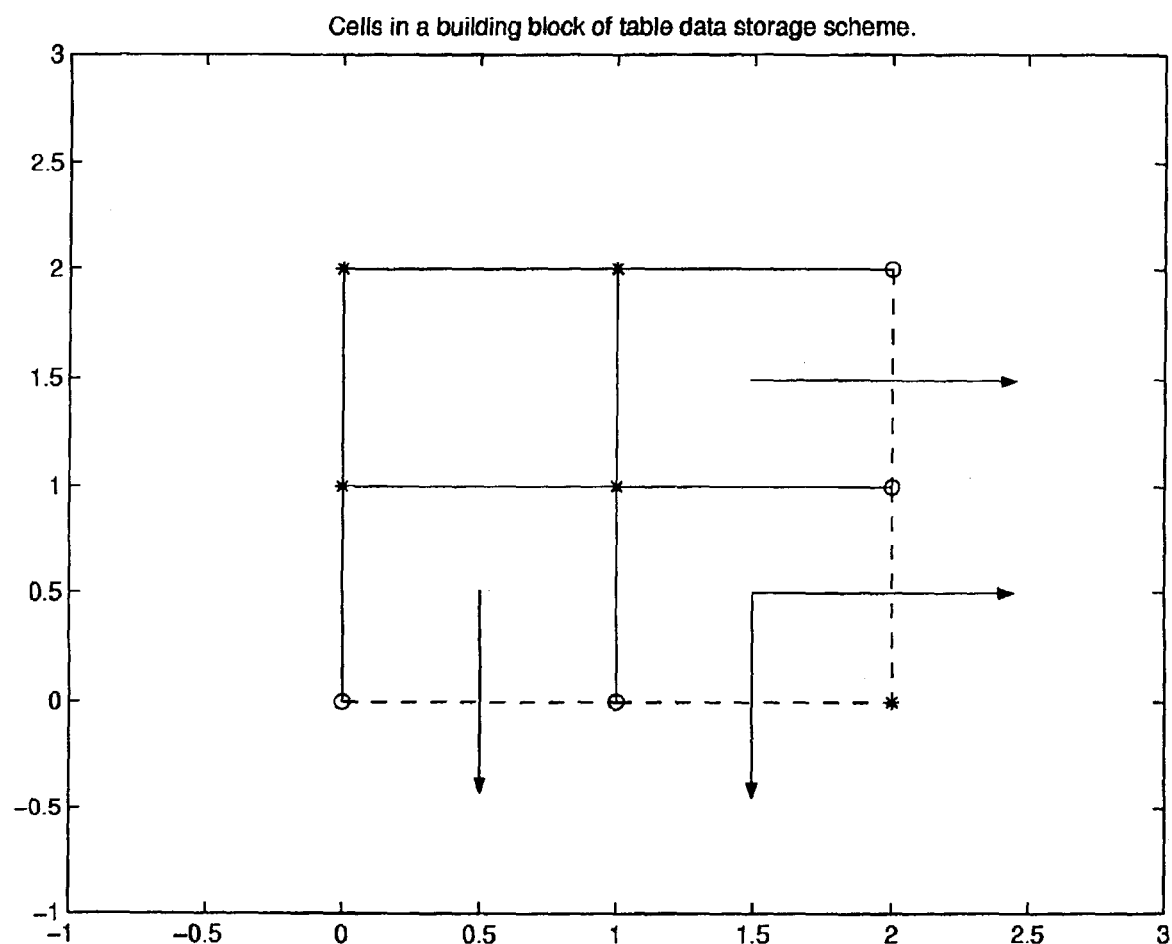
FIG. 4 schematically depicts the table data storage scheme.

The scheme is described here assuming the grid is two-dimensional (2-D). In other embodiments, this scheme is extended to other dimensions. The building block of 2-D table model storage scheme consists of four neighboring cells spanning in both dimensions, as shown in FIG. 2. It may not be feasible to save all the table model entries associated with these four cells, since many overlapping information would be stored and the table size would be much bigger than necessary. As an alternative, only a part of the entries are stored to enable fast data gathering and small table size. FIG. 4 schematically depicts a selection of the entries. The solid lines in FIG. 4 represent the ENO polynomial information to be stored while the dashed lines represent those to be skipped. The stars represent the corner point values to be stored while the circles represent the corner points to be skipped.

With this scheme, the left-top cell contains all the information it needs for table evaluation. The right-top and the left-bottom cells only need to access one neighboring building block, as shown by the arrows in FIG. 4. Only the right-bottom cell needs to access two neighboring building blocks for information. The average is just one neighboring building block access per cell.

In one embodiment, a dynamic table construction strategy is used to further reduce the overlap. Specifically, when model evaluation is required at an operating point, only the building blocks containing the operating point and some neighboring building blocks are constructed. This leads to big savings in memory in many cases. The building blocks may be stored in a hash table with efficient look-up schemes for easy and fast access. Keys of the hash table may be integers representing operating points. Values of the hash table can be build blocks containing operating points. Hash functions can be developed using well-known algorithmic methods to ensure a one-to-one mapping between the keys and values of the hash table and efficient look-up.

Figure 5:
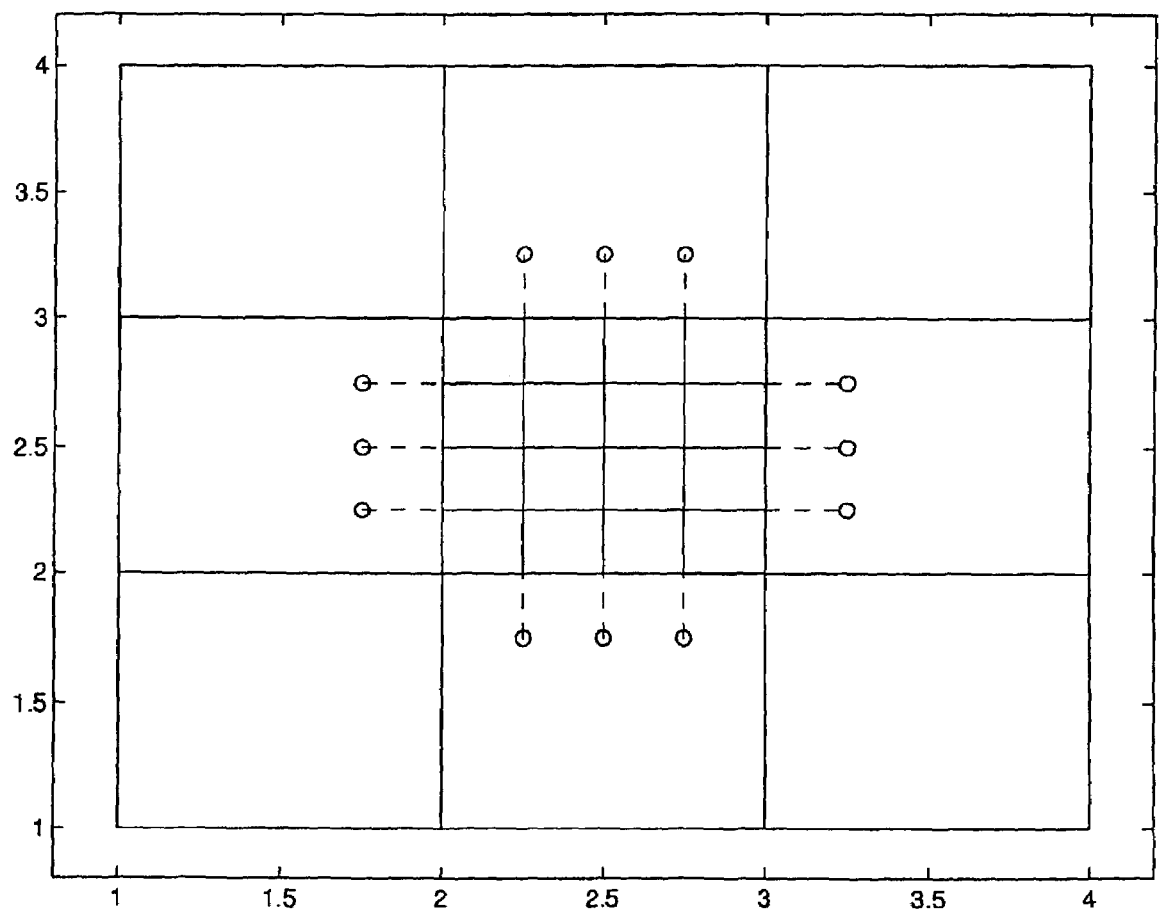
FIG. 5 schematically depicts the non-uniform grid table.

The building blocks or grid cells may be of either uniform or non-uniform size. For evaluation of electronic device models, the grid is non-uniform in nature since electronic devices, such as transistors, may exhibit sharp transition behavior in certain grid regions and finer cells are required to reflect these sharp transitions. FIG. 5 schematically depicts a non-uniform grid for approximating the behavior of a MOSFET transistor. The solid lines represent the edges that need approximation. For some edges of the smaller-sized cells, there is no grid point to the left or the right in the table, the dashed lines show the extended, but not stored, points that is needed to build the non-uniform table. In one embodiment, the circles are considered as part of the stencil in performing ENO approximation.

In one embodiment, it possible to combine ENO approximating of different orders is combined on different edges. For example, a third-order approximation in the exponential region of BJTs while using quadratic or even linear approximation in other regions may be applied. With the use of transfinite blending functions, the approximation is still smooth across shared boundaries.

Figure 6:
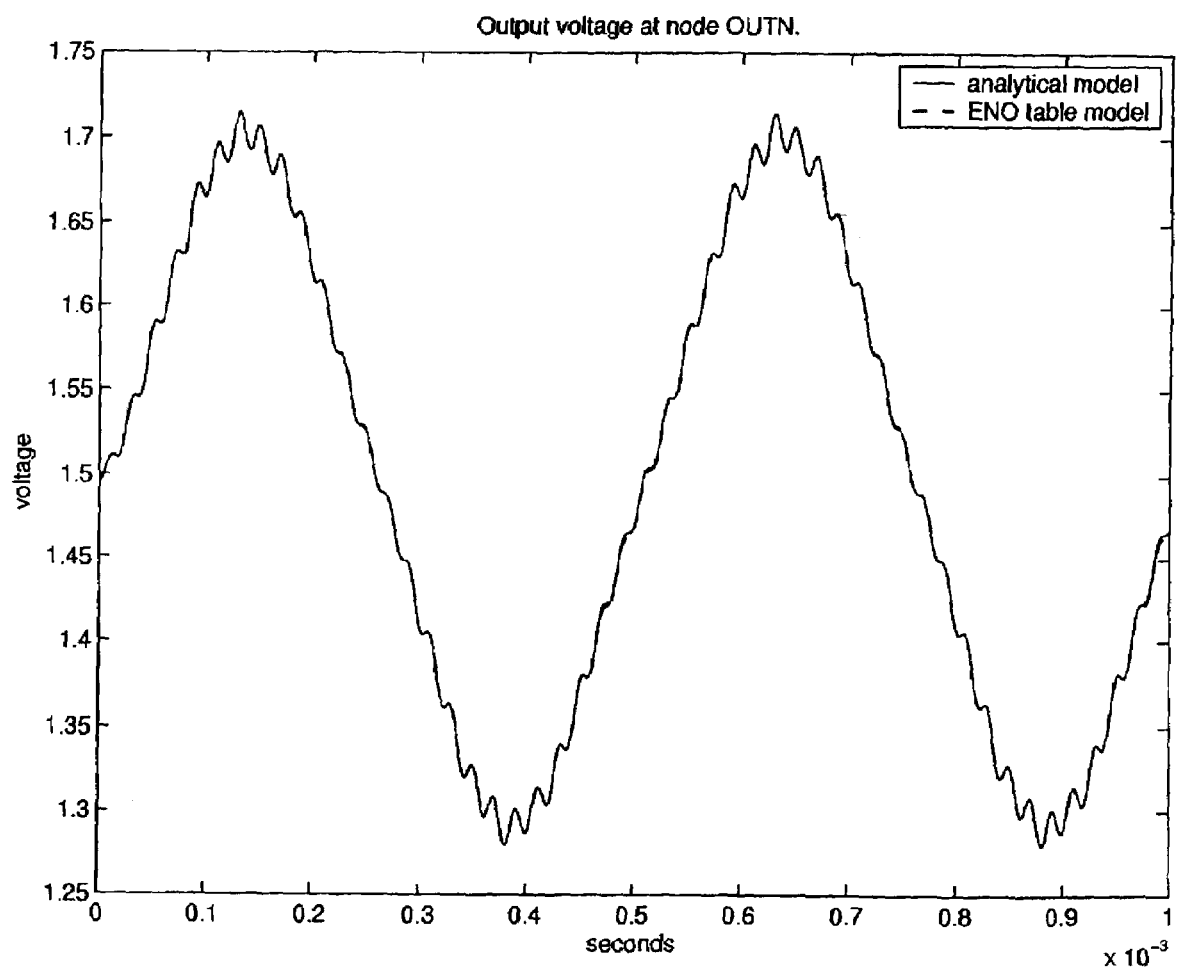
FIGS. 6–10 demonstrate simulation results using the ENO-based approximation method.

One embodiment has been tested in the simulation of thousands of digital, analog, and mixed-signal circuits. Results show that the method described above turns out to be very robust and does not have convergence problems. FIG. 6 shows the speed improvement of using the ENO-based table model method described above in the simulation of a switched-capacitor circuit. By using the ENO-based method, a speed-up of 5 times over the same simulation using the prior art analytical model simulation has been achieved. The actual simulation data is shown in Table 1. associated with FIG. 6. This fact shows that the ENO-based method is also more accurate than the prior art analytical model simulation.

Figure 7:
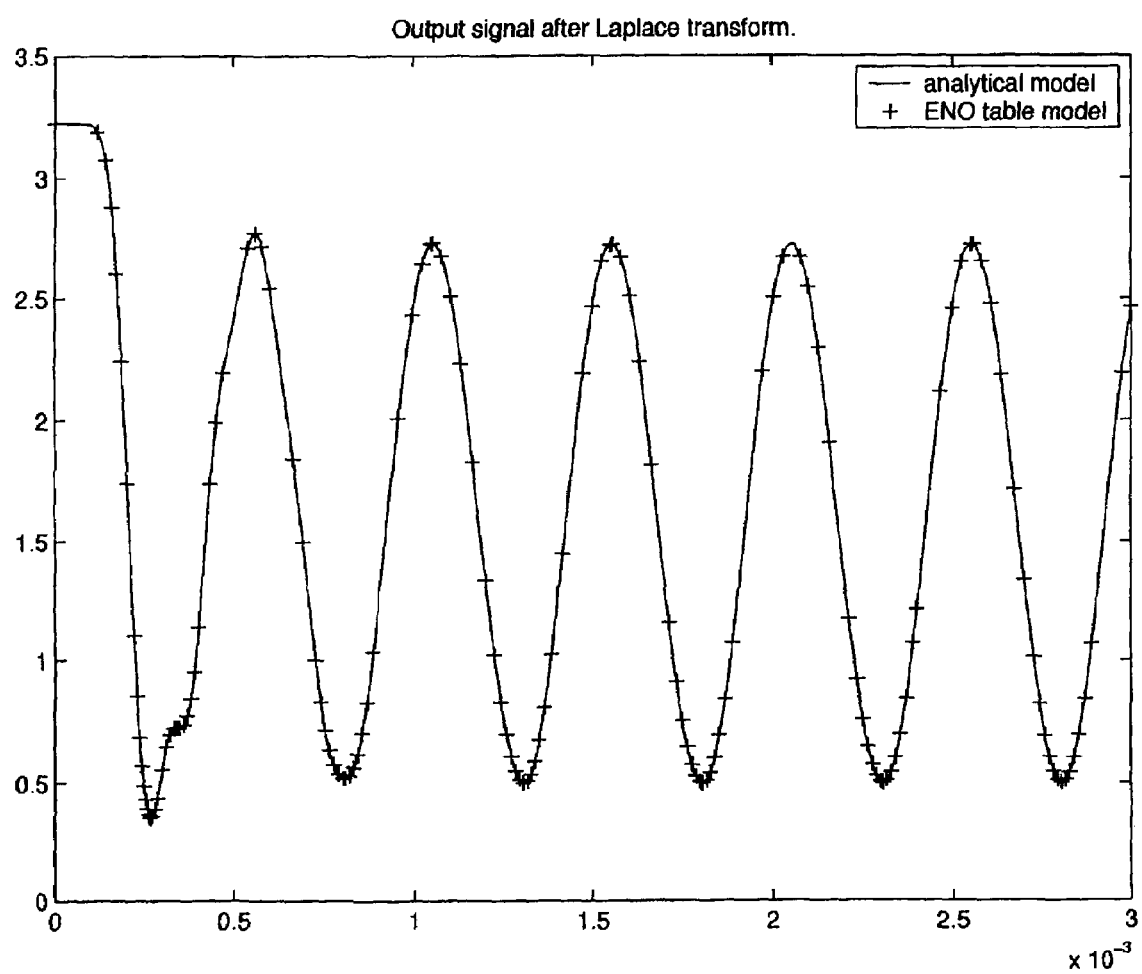
Figure 8:
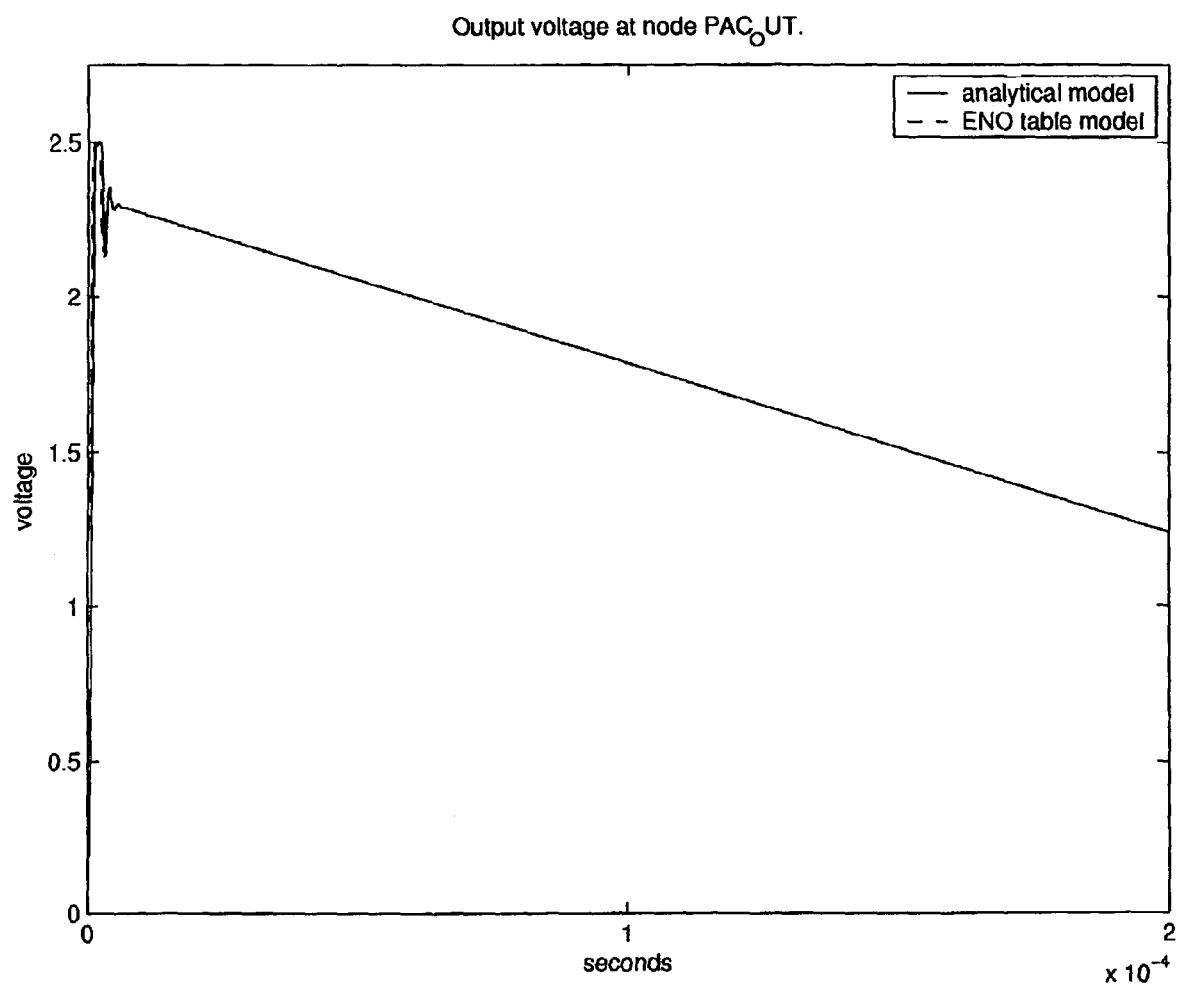
Figure 9:
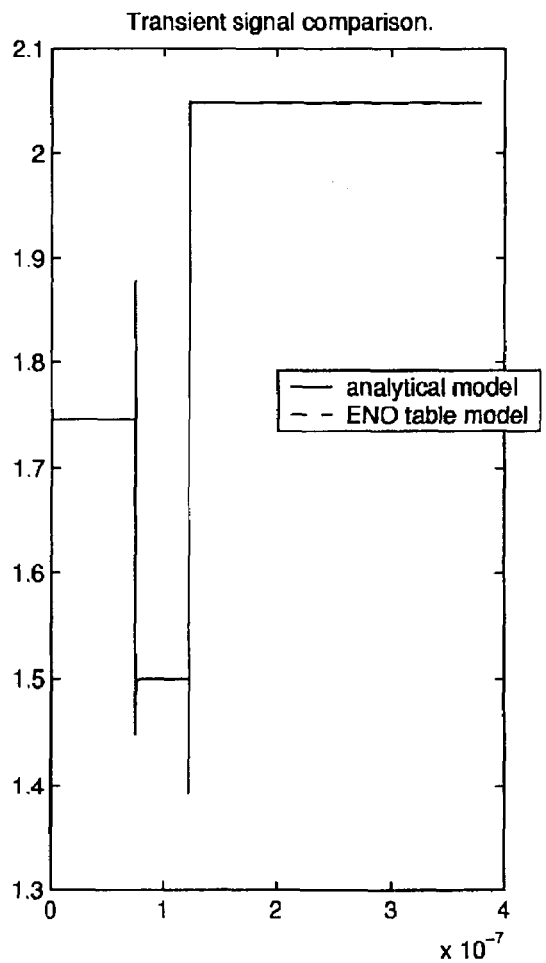
Figure 10:
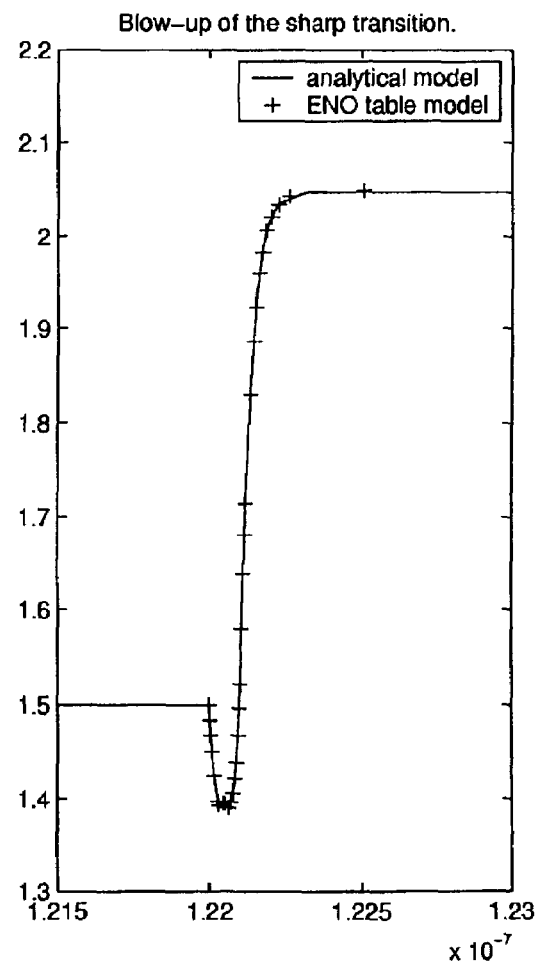

The speed and accuracy of the ENO-based table model method described above can be further demonstrated by additional simulations. FIG. 7 shows the result of the simulation of a sigma-delta converter circuit containing 12222 MOSEFTs and hundreds of other devices. The ENO-based method yields a speed-up of 3.5 times, as shown by Table 1. One can see from FIG. 7 that there is almost no difference between the approximation and the actual curve. FIG. 8 demonstrates the simulation of a digital-analog converter containing 12553 MOSEFTs using the ENO-based method. The result shows that the ENO-based method matches the original curve even for the initial oscillations. The simulation is 4.5 times faster than prior art methods that use analytical model. FIG. 9 shows the simulation of a memory circuit consisting of 108267 elements, most of which are MOSEFTs. The ENO-based method is more than two times faster than prior art methods that use analytical model. Finally, FIG. 10 shows simulation of a clock-tree circuit consisting of 2833737 elements, most of which are MOSEFTs, diodes, and RC parasitic. The ENO-based method finishes the transient simulation and delay measurements in just a couple of thousands of seconds.

TABLE 1

Simulation Results in Seconds

| Model-Test | Switch-Cap Filter | Sigma-Delta | D/A Converter |
|---|---|---|---|
| ENO table model | 1580 | 8900 | 7150 |
| Analytical model | 8072 | 33000 | 32100 |

While the above invention has been described with reference to certain preferred embodiments, the scope of the present invention is not limited to these embodiments. One skilled in the art may find variations of these preferred embodiments which, nevertheless, fall within the spirit of the present invention, whose scope is defined by the claims set forth below.

REFERENCES

[1] A. Harten, B. Engquist, S. Osher and S. Chakravarthy, "Some results on uniformly high order accurate essentially non-oscillatory schemes," *Applied Numerical Mathematics*, v2 (1986), pp. 347–377.
[2] W. J. Gorgon and C. A. Hall, "Transfinite element methods: Blending-Function interpolation over arbitrary curved element domains," *Numerical Mathematics*, vol. 21, pp. 109–129, 1973.
[3] Chi-Wang Su, "Numerical experiments on the accuracy of ENO and modified ENO schemes," *Journal of Scientific Computing*, v5 (1990), pp. 127–149.

What is claimed is:

1. A method for obtaining smooth and accurate approximations of an analytical device model, comprising the steps of:
   identifying a first set of measurement units;
   locating two or more sets of units that neighbor one or more of said measurement units;
   for each of the two or more sets of neighbor units, obtaining the union of one or more of said sets of neighbor units and said first set of measurement units;
   calculating the smoothness of the analytical device model within one or more of said unions; and
   selecting the union within which the analytical device model is the smoothest as a new set of measurement units.
2. The method of claim 1, wherein the step of selecting further comprises the steps of:
   selecting a preferred one of said unions; and
   weighting the smoothness towards said preferred union.
3. The method of claim 1, further comprising the step of: recording the calculated smoothness of the analytical device model within the selected union.
4. The method of claim 1, further comprising the step of: constructing an approximation of the analytical device model based on the new set of measurement units and the smoothness calculation.
5. The method of claim 4, wherein the approximation is a polynomial approximation.
6. The method of claim 4, wherein the first set of measurement units are a set of adjacent cells $$I_i \equiv \left[v_{i-\frac{1}{2}}, v_{i+\frac{1}{2}}\right], i = 1, 2, \ldots N,$$

on a one-dimensional grid $$a = v_{\frac{1}{2}} < v_{\frac{3}{2}} < \ldots v_{N-\frac{1}{2}} < v_{N+\frac{1}{2}}.$$

7. The method of claim 6, wherein the neighboring units are cells $$\left[v_{i-\frac{3}{2}}, v_{i-\frac{1}{2}}\right] \text{ and } \left[v_{i+\frac{1}{2}}, v_{i+\frac{3}{2}}\right].$$

8. The method of claim 7, wherein the smoothness of the analytical device model q(.) within each union of units is calculated by divided differences defined by:

$$Q\left[v_{i-r-\frac{1}{2}}\right] \equiv q\left(v_{i-r-\frac{1}{2}}\right), i = 1, 2, \ldots N,$$

and $$Q\left[v_{i-r-\frac{1}{2}}, \ldots, v_{i-r+j-\frac{1}{2}}\right] \equiv$$

$$\frac{Q\left[v_{i-r+\frac{1}{2}}, \ldots, v_{i-r+j-\frac{1}{2}}\right] - Q\left[v_{i-r-\frac{1}{2}}, \ldots, v_{i-r+j-\frac{3}{2}}\right]}{v_{i-r+j-\frac{1}{2}} - v_{i-r-\frac{1}{2}}} \text{ for } j \geq 1.$$

where r is either 0 or 1.

9. The method of claim 7, wherein the approximation of the analytical model is constructed by a polynomial:

$$p(v) = \sum_{j=0}^{k} Q\left[v_{i-r-\frac{1}{2}}, \ldots, v_{i-r+j-\frac{1}{2}}\right] \sum_{m=0, m \neq r}^{j-1} \prod_{m=0}^{j-1} \left(v - v_{i-r+m-\frac{1}{2}}\right),$$

where r is either 0 or 1.

10. The method of claim 1, wherein the first set of measurement units are a set of adjacent cells on a grid.
11. The method of claim 10, wherein the neighboring units are located based on cells neighboring the set of adjacent cells on the grid.
12. The method of claim 10, further comprising the step of:
   reducing the size of the cells on the grid to produce a refined set of stencil points.
13. A method for obtaining smooth and accurate approximations of analytical device models in a m-dimensional manifold, comprising the steps of:
   providing a partition of the measurement space, and
   for each partition, executing the steps of claim 1.
14. A system for obtaining smooth and accurate approximations of an analytical device model, the system comprising a computer for executing computer instructions, wherein the computer includes computer instructions for the method of claim 1.
15. A method for obtaining smooth and accurate approximations of an analytical device model in a (m+1)-dimensional manifold where m is an integer, comprising the steps of:
   identifying a first set of measurement units in the (m+1)-dimensional manifold;
   locating two or more set of units that neighbor one or more of said measurement units;

obtaining, for each m-dimensional boundary of the (m+1)-dimensional manifold, an approximation of the analytical device model based on the two or more sets of neighboring units and the first set of measurement units; and blending the approximations obtained for each m-dimensional boundary of the (m+1)-dimensional manifold to produce an approximation of the analytical device model.

16. The method of claim 15, wherein the step of locating further comprises the step of:

locating two or more sets of units in a subspace of the (m+1)-dimensional manifold.

17. The method of claim 15, wherein the step of obtaining further comprises the steps of:

obtaining, for each m-dimensional boundary of the (m+1)-dimensional manifold, a union of each set of the two or more sets of neighboring units and said first set of measurement units;

calculating the smoothness of the approximation for each said union; and selecting the union that renders the smoothest approximation of the analytical device model.

18. The method of claim 17, wherein the step of obtaining further comprises the step of:

mapping each of the two or more sets of neighboring units and the first set of measurement units to a standard unit element in the (m+1)-dimensional manifold.

19. The method of claim 18, wherein the step of blending further comprises the steps of:

projecting the faces, edges, and vertices of each standard unit element to an approximated curve based on the approximations obtained for each m-dimensional boundary of the (m+1)-dimensional manifold.

20. The method of claim 17, wherein the (m+1)-dimensional manifold is a (m+1)-dimensional grid.

21. The method of claim 17, wherein the standard unit element is a unit cube.

22. The method of claim 15, wherein the step of identifying further comprises the step of identifying a first set of measurement units in the neighborhood of an operating point of the analytical device model.

23. A system for obtaining smooth and accurate approximations of an analytical device model in a (m+1)-dimensional manifold where m is an integer, the system comprising a computer for executing computer instructions, wherein the computer includes computer instructions for the method of claim 15.

24. A method for reducing memory usage during circuit simulation, comprising the steps of:

identifying one or more operating points for the circuit simulation;

obtaining, for each of the one or more operating points, a set of measurement points surrounding said operating point;

eliminating overlapping boundaries among each set of measurement points; and constructing a hash table for storing each set of measurement points.

25. The method of claim 24, wherein said one or more operating points are identified dynamically during the circuit simulation.

26. The method of claim 24, wherein the step of constructing a hash table further comprises the steps of:

transforming each of the one or more operating points into a unique integer; and constructing a hash function, said hash function providing a one-to-one mapping between the unique integers and the sets of measurement points.

27. A system for reducing memory usage during circuit simulation, the system comprising a computer for executing computer instructions, wherein the computer includes computer instructions for the method of claim 24.

* * * * *